(12) United States Patent
Ku et al.

(10) Patent No.: US 11,189,791 B2
(45) Date of Patent: Nov. 30, 2021

(54) INTEGRATED CIRCUIT AND FABRICATION METHOD THEREOF

(71) Applicant: TAIWAN SEMICONDUCTOR MANUFACTURING CO., LTD., Hsinchu (TW)

(72) Inventors: Ming-Che Ku, Hsinchu (TW); Jiun-Yu Tsai, Hsinchu (TW); Hung-Cho Wang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/789,736

(22) Filed: Feb. 13, 2020

(65) Prior Publication Data
US 2021/0135106 A1    May 6, 2021

Related U.S. Application Data

(60) Provisional application No. 62/928,033, filed on Oct. 30, 2019.

(51) Int. Cl.
*H01L 45/00*    (2006.01)
*H01L 27/24*    (2006.01)
*H01L 21/768*    (2006.01)

(52) U.S. Cl.
CPC ........ *H01L 45/16* (2013.01); *H01L 21/76802* (2013.01); *H01L 27/2436* (2013.01); *H01L 45/1253* (2013.01)

(58) Field of Classification Search
CPC ............................ H01L 45/16; H01L 45/1233
See application file for complete search history.

(56) References Cited

U.S. PATENT DOCUMENTS 10,158,069 B2 * 12/2018 Hsieh .................. H01L 45/1226

* cited by examiner

*Primary Examiner* — Mark V Prenty
(74) *Attorney, Agent, or Firm* — Birch, Stewart, Kolasch & Birch, LLP

(57) ABSTRACT

A method for fabricating an integrated circuit is provided. The method includes forming a memory cell over a substrate, wherein the memory cell comprising a top electrode, a bottom electrode, and a resistance switching element between the bottom electrode and the top electrode; forming a dielectric layer over the memory cell and the substrate; etching a via opening in the dielectric layer to expose the top electrode of the memory cell; forming a spacer in the via opening; performing a liner removal process to the dielectric layer after forming the spacer; and forming a conductive feature connected to the top electrode in the via opening.

20 Claims, 11 Drawing Sheets

INTEGRATED CIRCUIT AND FABRICATION METHOD THEREOF

PRIORITY CLAIM AND CROSS-REFERENCE

This application claims priority to U.S. Provisional Application Ser. No. 62/928,033, filed Oct. 30, 2019, which is herein incorporated by reference.

BACKGROUND

Semiconductor memories are used in integrated circuits for electronic applications, including radios, televisions, cell phones, and personal computing devices, as examples. Semiconductor memory device involves volatile memory or non-volatile memory. Volatile memory stores data when it is powered, while non-volatile memory is able to store data when power is removed. Many promising candidates for a next generation non-volatile memory technology use memory cells that are located between metal interconnect layers overlying a semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
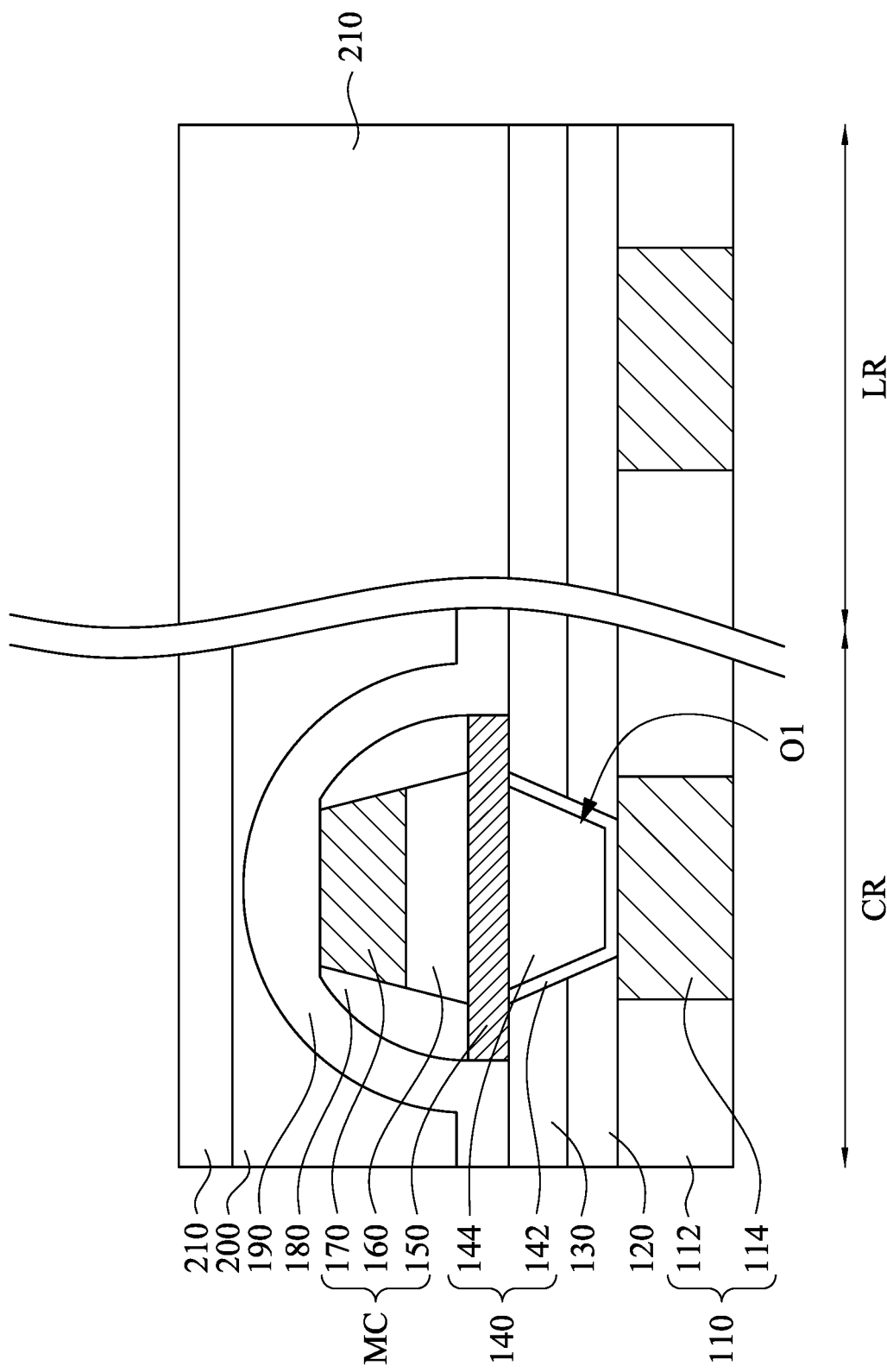
FIGS. 1A-1I are cross-sectional views of an integrated circuit at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In integrated circuit (IC) devices, resistance-based random access memory, such as resistive random access memory (RRAM, ReRAM), magnetoresistive random access memory (MRAM), and phase-changed random access memory (PCRAM), are being developed for next generation memory devices. Compared with charge-based random access memory, such as flash memory, a resistance-based random access memory circuit includes an array of memory cells each of which is capable of having at least a high resistance state and a low resistance state. Setting a resistance state of a memory cell of a resistance-based random access memory circuit (i.e., performing a write operation to the memory cell) is usually accomplished by applying a predetermined voltage difference or a predetermined current to the memory cell. When reading a datum from a memory cell, a predetermined reading current (or voltage) is applied to the memory cell, and the output datum is determined according to the resulting voltage (or current) of the memory cell.

The resistance-based random access memory device is exemplarily illustrated as a MRAM device in the embodiments of the present disclosure. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the resistance-based random access memory device is formed within a chip region of a substrate. A plurality of semiconductor chip regions is marked on the substrate by scribe lines between the chip regions. The substrate will go through a variety of cleaning, layering, patterning, etching and doping steps to form the resistance-based random access memory devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIGS. 1A-1I are cross-sectional views of an integrated circuit at various intermediate stages of manufacture according to various embodiments of the present disclosure. The illustration is merely exemplary and is not intended to be limiting beyond what is specifically recited in the claims that follow. It is understood that additional operations may be provided before, during, and after the operations shown by FIG. 1A-1I, and some of the operations described below can be replaced or eliminated for additional embodiments of the method. The order of the operations/processes may be interchangeable.

FIG. 1A illustrates a wafer having a substrate 110 thereon. The substrate 110 has a logic region LR where logic circuits are formed and a cell region CR where memory devices MC are formed. The substrate 110 includes an interlayer dielectric (ILD) layer or inter-metal dielectric (IMD) layer 112 with a metallization pattern 114 over the logic region LR and the cell region CR. The interlayer dielectric layer 112 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 114 may be aluminum, aluminum alloy, copper, copper alloy, titanium, titanium nitride, tantalum, tantalum nitride, tungsten, cobalt, the like, and/or combinations thereof. Formation of the metallization pattern 114 and the interlayer dielectric layer 112 may be a dual-damascene process and/or a single-damascene process. The substrate 110 may also include active and passive devices, for example, underlying the interlayer dielectric layer 112. These further components are omitted from the figures for clarity. An etch stop layer 120 and a dielectric layer 130 are formed over the logic region LR and the cell region CR of the substrate 110. The etch stop layer 120 may have a high etch resistance to one or more subsequent etching processes than that of the interlayer dielectric layer 112 and the dielectric layer 130. The etch stop layer 120 may be formed of dielectric material different from the underlying interlayer dielectric layer 112 and the dielectric layer 130. For example, in some embodiments where the interlayer dielectric layer 112 and the dielectric layer 130 are silicon oxide layers, the etch stop layer 120 may be a silicon nitride layer or a silicon carbide layer.

The dielectric layer 130 in some embodiments is a silicon-rich oxide layer. For example, the dielectric layer 130 may include silicon dioxide, silicon oxynitride (SiON), silicon dioxide, the like, and/or combinations thereof. The dielectric layer 130 may be a single-layered structure or a multi-layered structure. The dielectric layer 130 may be formed by acceptable deposition techniques, such as chemical vapor deposition (CVD), atomic layer deposition (ALD), physical vapor deposition (PVD), the like, and/or a combination thereof. In some embodiments, a protective layer, such as an aluminum-based layer (e.g., aluminum oxide layer or aluminum nitride layer) may be formed between the etch stop layer 120 and the dielectric layer 130.

At least one via openings O1 is formed in the etch stop layer 120 and the dielectric layer 130 in the cell region CR, and exposes portions of the metallization pattern 114. An exemplary formation method of the via opening O1 includes forming a patterned mask over the dielectric layer 130, and then etching the dielectric layer 130 and the etch stop layer 120 through the patterned mask by one or more etching processes. After the formation of the via opening O1, a bottom electrode via (BEVA) 140 is then formed within the via opening O1.

In some embodiments, the BEVA 140 may be a multi-layered structure and includes, for example, a diffusion barrier layer 142 and a filling metal 144 filling a recess in the diffusion barrier layer 142. An exemplary formation method of the BEVA 140 includes forming in sequence the diffusion barrier layer 142 and the filling metal 144 into the via opening O1, and performing a planarization process, such as a chemical-mechanical polish (CMP) process, to remove excess materials of the filling metal 144 and of the diffusion barrier layer 142 outside the via opening O1. The remaining diffusion barrier layer 142 and the remaining filling metal 144 in the via opening O1 can serve as the BEVA 140. In some embodiments, the BEVA 140 are electrically connected to an underlying electrical component, such as a transistor, through the metallization pattern 114.

In some embodiments, the diffusion barrier layer 142 is a titanium nitride (TIN) layer or a tantalum nitride (TaN) layer, which can act as a suitable barrier to prevent metal diffusion. Formation of the diffusion barrier layer 142 may be exemplarily performed using CVD, PVD, ALD, the like, and/or a combination thereof. In some embodiments, the filling metal 144 is titanium (Ti), tantalum (Ta), platinum (Pt), ruthenium (Ru), tungsten (W), aluminum (Al), copper (Cu), TiN, TaN, the like, and/or combinations thereof. Formation of the filling metal 144 may be exemplarily performed using CVD, PVD, ALD, the like, and/or a combination thereof.

A memory device MC is then formed over the BEVA 140. The memory device MC may include a bottom electrode 150, a resistance switching element 160 over the bottom electrode 150, and a top electrode 170 over the resistance switching element 160. The formation of the memory device MC includes depositing a blanket bottom electrode layer, a resistance switching layer, and a top electrode layer over the top surface of the BEVA 140 and the top surface of the dielectric layer 130 in a sequence, patterning the top electrode layer and the resistance switching layer into the top electrode 170 and the resistance switching element 160 respectively. After the formation of the top electrode 170 and the resistance switching element 160, spacers 180 on opposites sidewalls of the top electrode 170 and the resistance switching element 160, and then the bottom electrode layer is patterned into the bottom electrode 150.

The bottom electrode 150 may extend along the top surface of the BEVA 140 and the top surface of the dielectric layer 130. The bottom electrode 150 can be a single-layered structure or a multi-layered structure. The bottom electrode 150 may include a material the same as the filling metal 144 in some embodiments. In some other embodiments, the bottom electrode 150 includes a material different from the filling metal 144. In some embodiments, the bottom electrode 150 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer may be exemplarily performed using CVD, PVD, ALD, the like, and/or a combination thereof.

The resistance switching element 160 may be a magnetic tunnel junction (MTJ) structure. To be specific, the resistance switching element 160 includes at least a first magnetic layer, a tunnel barrier layer and a second magnetic layer are formed in sequence.

In some embodiments, the first magnetic layer includes an anti-ferromagnetic material (AFM) layer and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD, e-beam or thermal evaporation, or the like.

The ferromagnetic pinned layer in the first magnetic layer forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element (e.g. a MTJ stack) fabricated from the resistance switching layer 160. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, e-beam or thermal evaporation, or the like. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element (e.g. a MTJ stack) fabricated from the resistance switching layer 160. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer 172 includes sputtering, PVD, ALD, e-beam or thermal evaporation, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron. An exemplary formation method of the second magnetic layer includes sputtering, PVD, ALD, e-beam or thermal evaporation, or the like.

The top electrode 170 includes a conductive material. In some embodiments, the top electrode 170 is similar to the bottom electrode 150 in terms of composition. In some embodiments, the top electrode 170 comprises titanium (Ti), tantalum (Ta), platinum (Pt), ruthenium (Ru), tungsten (W), aluminum (Al), copper (Cu), TiN, TaN, the like or combinations thereof. An exemplary formation method of the top electrode layer includes sputtering, PVD, ALD, e-beam or thermal evaporation, or the like.

The formation of the spacers 180 may include blanket forming a spacer layer over the top surfaces and sidewalls of the top electrode 170 and over sidewalls of the resistance switching element 160, and patterning the spacer layer into the spacers 180 by suitable anisotropic etching process. Material of the spacers 180 may be selected to protect the resistance switching elements 160 without influencing the function of the resistance switching elements 160. For example, the spacers 180 may include suitable dielectric materials such as silicon nitride, silicon carbide, carbon-doped silicon nitride, carbon-doped silicon oxide, silicon oxynitride, other suitable materials, and combinations thereof. In some embodiments, the spacers 180 may also be a composite layer including two or more layers made of different materials, such as a silicon nitride/silicon carbide stack. The spacer layer may be formed using CVD, PVD, ALD, the like, and/or combinations thereof.

After the formation of the spacers 180, the bottom electrode layer is patterned into the bottom electrode 150 by suitable etching process. The spacers 180 may protect the resistance switching element 160 from being etched during the etching process. In some embodiments, the dielectric layer 130 may also be etched by the etching process.

In the present embodiments, the memory device MC is exemplarily depicted as MRAM device. In some other embodiments, the memory device MC may be a RRAM device or a PCRAM device. For example, in some embodiments where the memory device MC is a RRAM device, the memory device MC may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

A protection layer 190 and a dielectric layer 200 may then be formed over the memory devices MC and the spacers 180 over the logic region LR. The protection layer 190 may include suitable dielectric materials such as silicon nitride, silicon carbide, carbon-doped silicon nitride, carbon-doped silicon oxide, silicon oxynitride, other suitable materials, and combinations thereof. In some embodiments, the protection layer 190 may also be a composite layer including two or more layers made of different materials, such as a silicon nitride/silicon carbide stack. The dielectric layer 200 may include silicon oxide. The formation of the dielectric layer 200 and the protection layer 190 may include depositing a protection film over the cell region CR and the logic region LR, depositing a dielectric film over the protection film, and removing a portion of the protection film and a portion of the dielectric film over the logic region LR. A remaining portion of the protection film and a remaining portion of the dielectric film forms the protection layer 190 and the dielectric layer 200, respectively. In some embodiments, the protection film may be formed using CVD, PVD, ALD, the like, and/or combinations thereof. In some embodiments, the dielectric film may be deposited by plasma-enhanced atomic layer deposition (PECVD).

In some embodiments, for example, an etching process is performed to remove the portion of the dielectric film and the portion of the protection film in the logic region LR until reaching the dielectric layer 130. The dielectric layer 130 may have a higher etch resistance to the etching process than that of the dielectric film and the protection film. In some other embodiments, the etching process may further remove a portion of the dielectric layer 130 in the logic region LR until reaching the etch stop layer 120. The etch stop layer 120 may have a higher etch resistance to the etching process than that of the dielectric film and the protection film.

An interlayer dielectric layer 210 may be then formed over the dielectric layer 200 over the cell region CR and over the logic region LR. In some embodiments, the interlayer dielectric layer 210 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. In some embodiments, after the formation of the interlayer dielectric layer 210, an etching process or a planarization process (e.g., CMP) may be performed to the interlayer dielectric layer 210 for reducing the height difference of the top surface of the interlayer dielectric layer 210 in the cell region CR and the logic region LR.

Figure 1B:
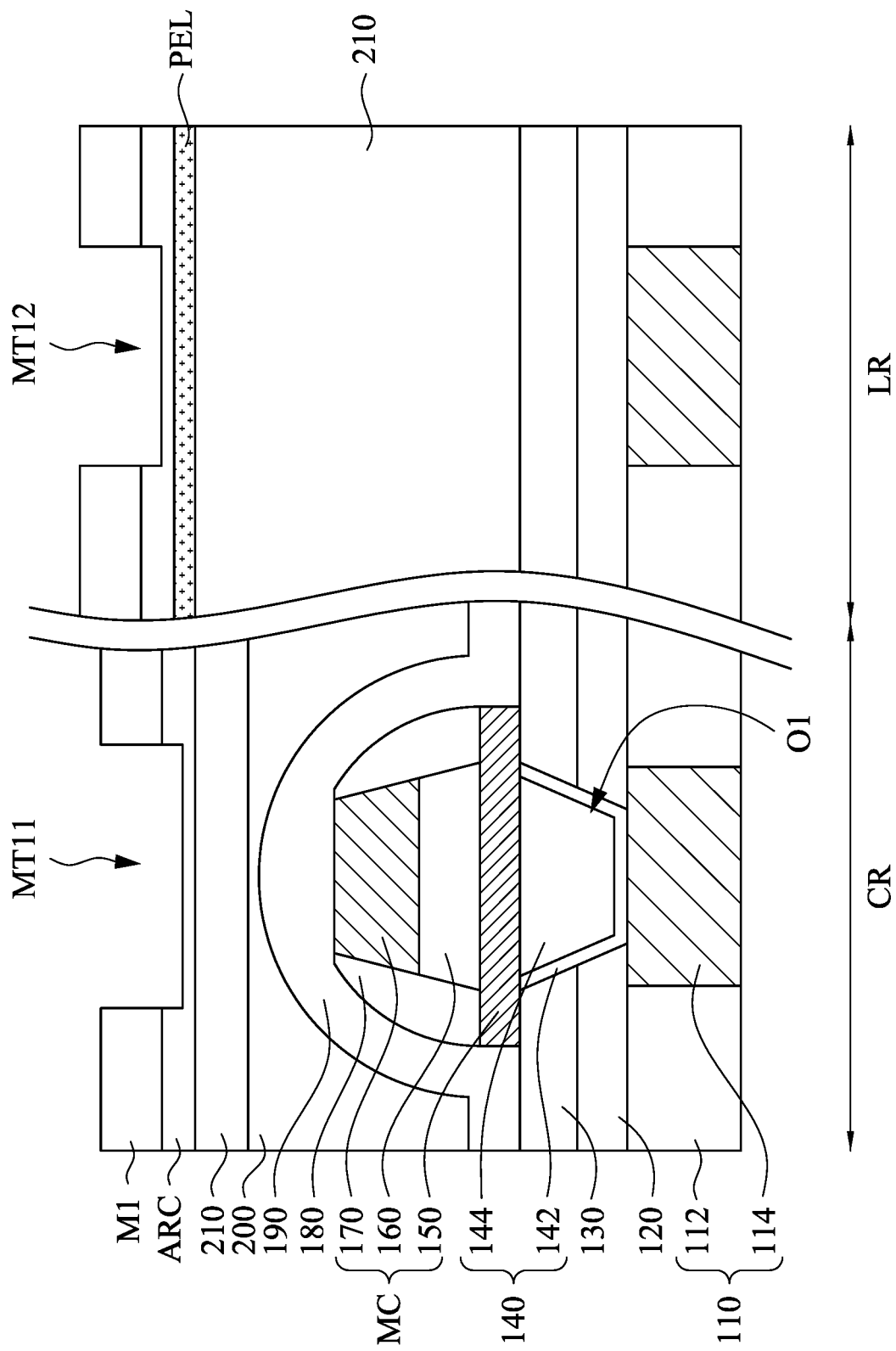

Reference is made to FIG. 1B. An anti-reflection layer ARC and a hard mask layer M1 are formed over a polished top surface of the interlayer dielectric layer 210 over the logic region LR and the cell region CR in a sequence, and trench openings MT11 and MT12 are formed in the mask layer M1. The anti-reflection layer ARC may be formed of an organic material, an oxide material, a nitride material, or the like. In some embodiments, the anti-reflection layer ARC may be nitrogen-free, thereby avoiding photoresist poisoning. For example, the anti-reflection layer ARC may include SiOC. The hard mask layer M1 may be a metal-containing hard mask layer. For example, the hard mask layer M1 may include titanium nitride or other suitable metal-containing materials. In some other embodiments, the hard mask layer M1 may include silicon nitride, silicon oxynitride, or other suitable materials.

The formation of the hard mask layer M1 having the trench openings MT11 and MT12 may include depositing a hard mask layer M1 over the interlayer dielectric layer 210, forming a resist layer (not shown) over the hard mask layer M1, and then patterning the resist layer into a patterned resist mask using a suitable photolithography process. The patterned resist mask may expose portions of the mask layer. In some embodiments, the patterned resist mask is a photoresist. In some embodiments, the patterned resist mask is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

One or more etching processes are then performed to remove portions of the hard mask layer M1 not protected by the patterned resist mask. The hard mask layer M1 may be etched using acceptable etching techniques, such as by using anisotropic etching processes, thereby forming the trench openings MT11 and MT12 in the hard mask layer M1 over the cell region CR and the logic region LR, respectively. In the present embodiments, the anti-reflection layer ARC may be consumed but not etched through, such that a portion of the anti-reflection layer ARC remains below the trench openings MT11 and MT12, and the underlying interlayer dielectric layer 210 is not exposed. In some other embodiments, the anti-reflection layer ARC may be etched through, and the interlayer dielectric layer 210 may be exposed by the mask layer M1. The patterned resist mask is then removed using, for example, an ash process, after the etching process.

In some embodiments, prior to the formation of the mask layer M1, another hard mask layer PEL is formed over the interlayer dielectric layer 210 in the logic region LR, not over the interlayer dielectric layer 210 in the cell region CR. The hard mask layer PEL may include SiC like material. The hard mask layer PEL may provide suitable mechanical strength for sustaining enough hardness over the underlying interlayer dielectric layer 210 in the logic region LR during subsequent etching processes (e.g., opening formation process), thereby preventing the underlying interlayer dielectric layer 210 from etch distortion. In some other embodiments, the hard mask layer PEL may be omitted.

Figure 1C:
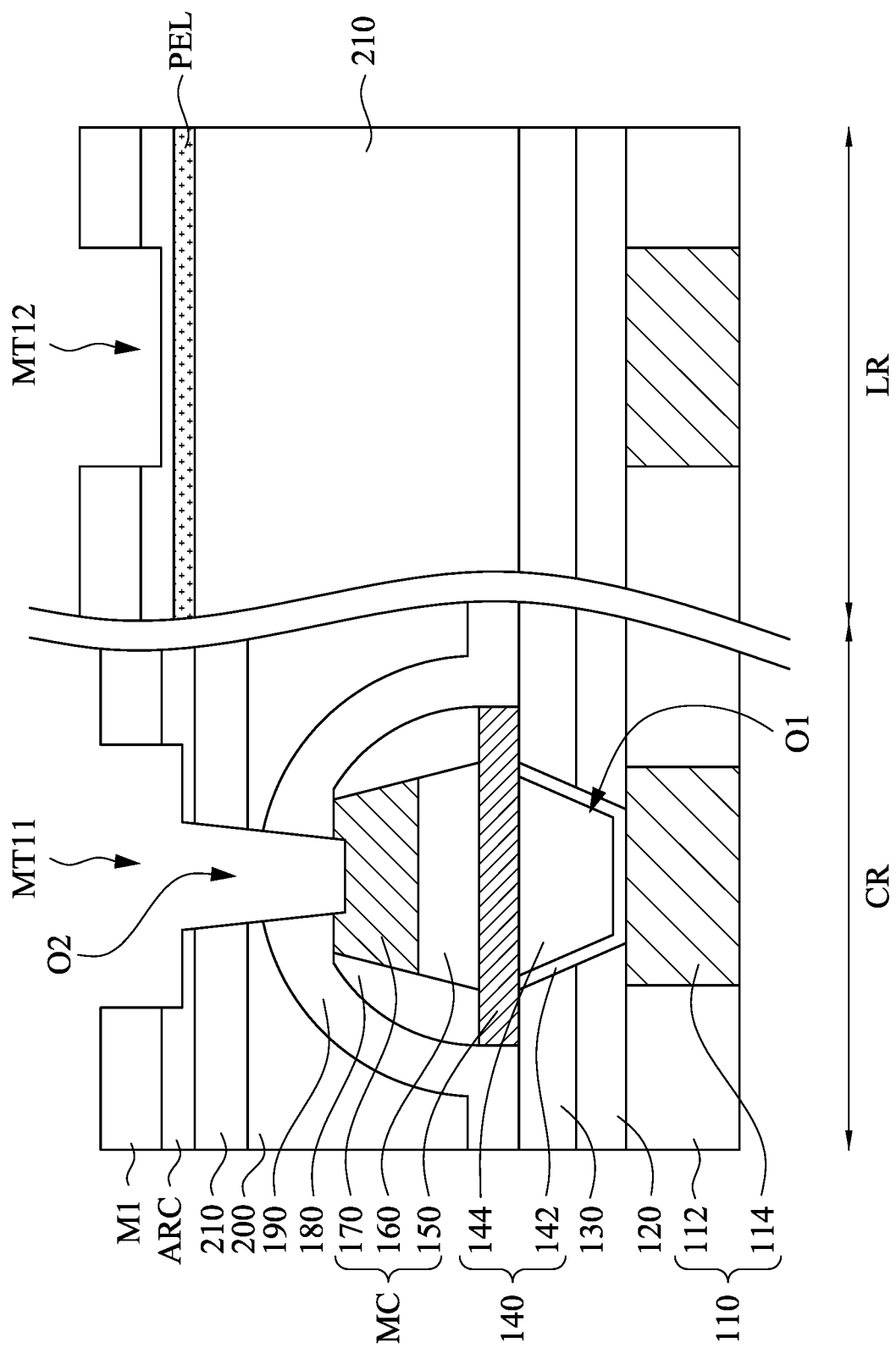

Reference is made to FIG. 1C. At least one via opening O2 is formed in the interlayer dielectric layer 210, the dielectric layers 200, and the protection layer 190 in the cell region CR. The via opening O2 may expose a top surface of the top electrode 170. The formation of the via opening O2 may include forming a resist layer (not shown) over the mask layer M1 and the interlayer dielectric layer 210, patterning the resist layer into a patterned resist mask using a suitable photolithography process, and remove portions of the anti-reflection layer ARC, the interlayer dielectric layer 210, the dielectric layers 200, and the protection layer 190 not protected by the patterned resist mask.

In some embodiments, the resist mask is a photoresist. In some embodiments, the resist mask is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof. The patterned resist mask may expose portions of the materials (e.g., the anti-reflection layer ARC and/or the interlayer dielectric layer 210) in the cell region CR and cover the entire logic region LR.

Then, one or more etching processes are then performed to remove portions of the anti-reflection layer ARC, the interlayer dielectric layer 210, the dielectric layers 200, and the protection layer 190 not protected by the patterned resist mask, thereby forming the via opening O2. The etching processes may include suitable anisotropic etching processes, such as dry etch. In some embodiments where the dielectric layers 200 and the interlayer dielectric layer 210 includes silicon oxide, the etchant used in etching the via opening O2 can be dilute hydrofluoric acid (HF), HF vapor, $CF_4$, $C4F_8$, $CH_xF_y$, $C_xF_y$, $SF_6$, or $NF_3$, Ar, $N_2$, $O_2$, Ne, gas. In some embodiments, the etching processes may further consume and therefore remove a portion of the top electrode 170. The patterned resist mask is then removed using, for example, an ash process, after the etching process.

Figure 1D:
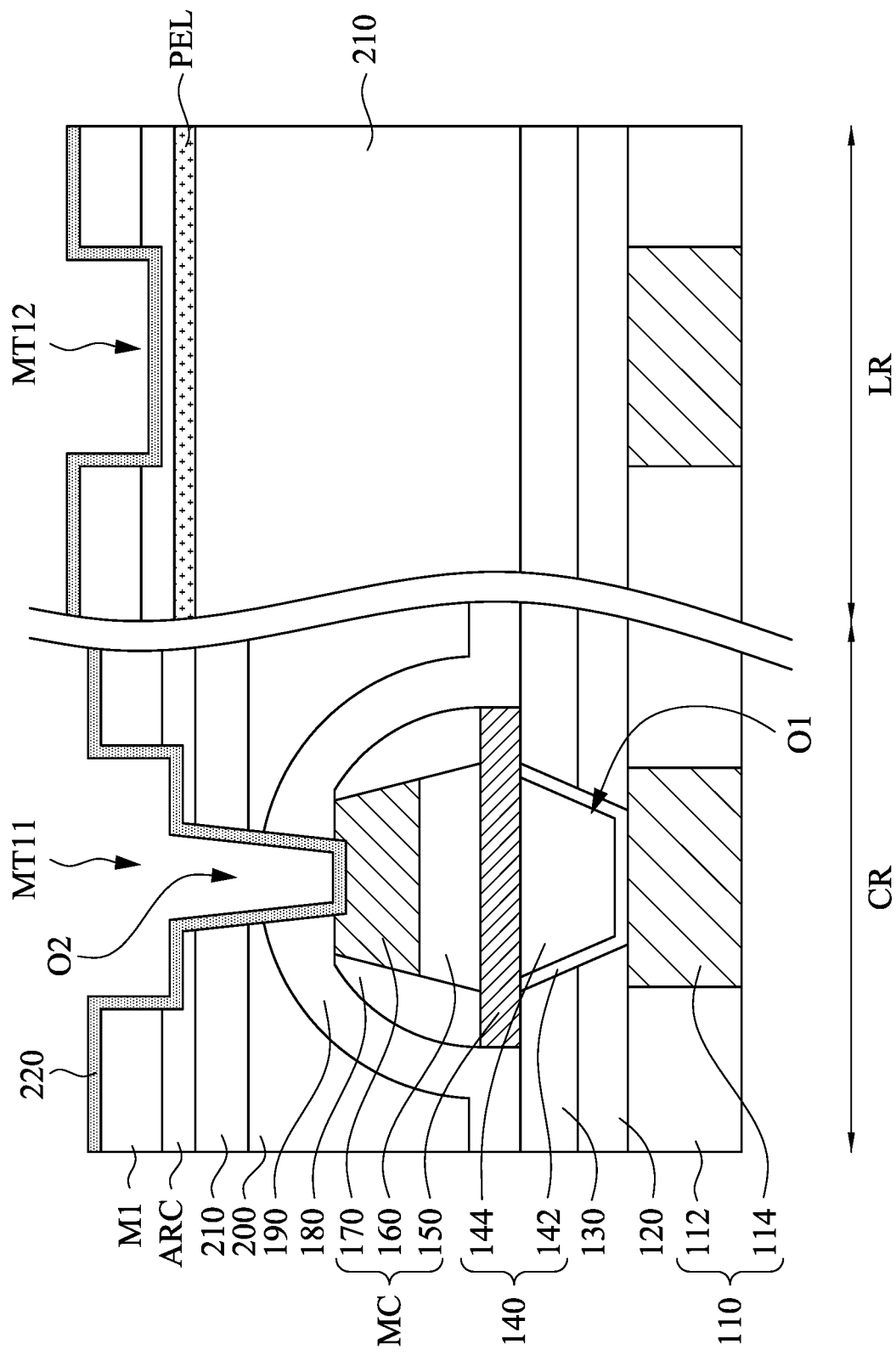

Reference is made to FIG. 1D. A protection spacer layer 220 is conformally deposited over the structure of FIG. 1C. The protection spacer layer 220 may extends through the trench openings MT11 and MT12 into the via opening O2. The protection spacer layer 220 may include silicon oxide, silicon nitride, silicon oxynitride, silicon carbide, other suitable material, or the combination thereof. The protection spacer layer 220 may be deposited by suitable plasma-enhanced deposition, such as plasma-enhanced CVD, plasma-enhanced ALD, other suitable deposition method, and or the combination thereof. In some other embodiments, the protection spacer layer 220 may include ceramic materials, such as AlOx, AlN, AlON.

Figure 1E:
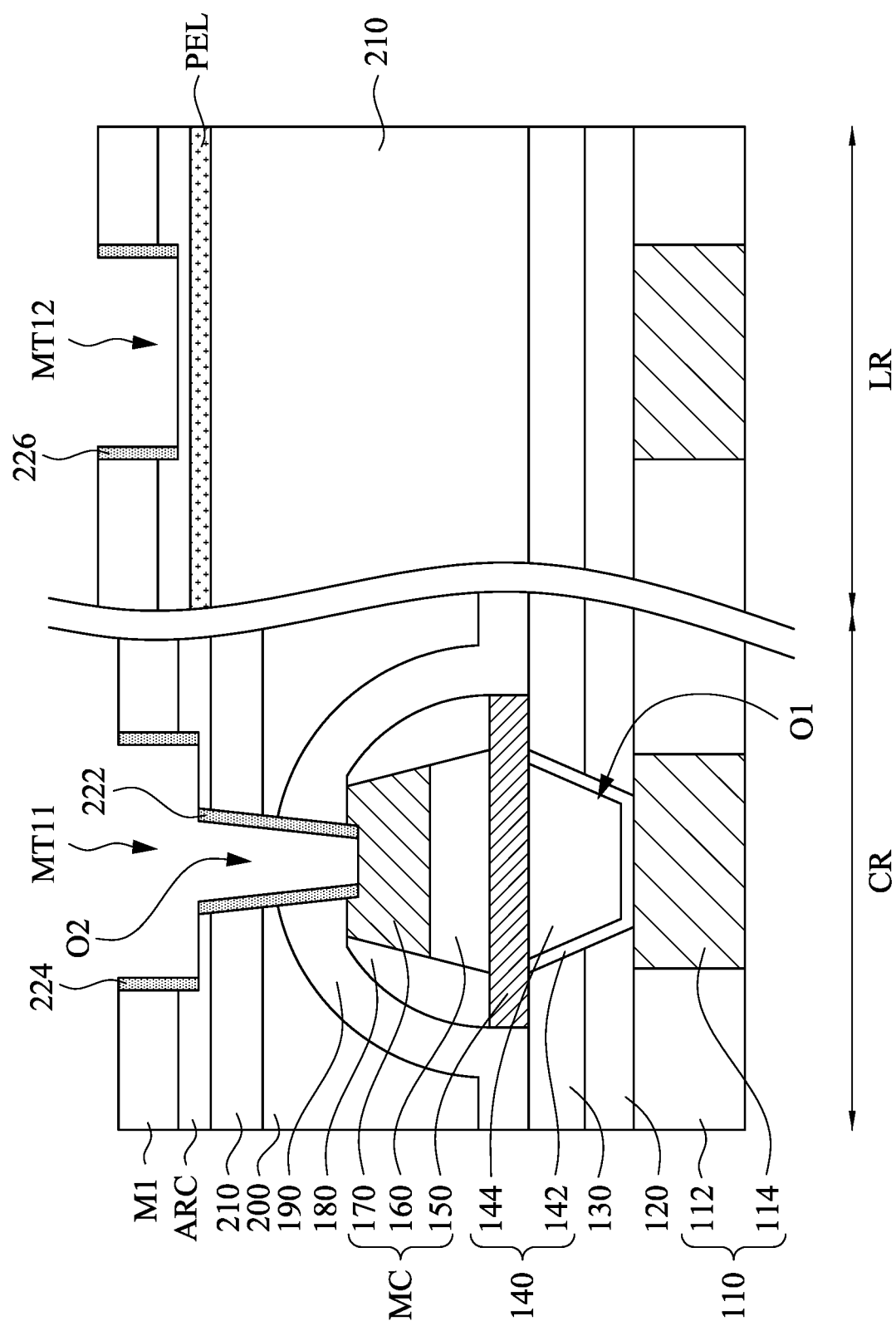

FIG. 1E illustrates patterning of the protection spacer layer 220 (referring to FIG. 1D). The patterning process removes horizontal portions of the protection spacer layer 220 (referring to FIG. 1D) while remaining vertical portions of the protection spacer layer 220 (referring to FIG. 1D). The remaining portions of the protection spacer layer 220 (referring to FIG. 1D) can be referred to as protection spacers 222, 224, and 226. In some embodiments, the patterning of the protection spacer layer 220 (referring to FIG. 1D) may include suitable anisotropic dry etching process. In some embodiments where the protection spacer layer 220 (referring to FIG. 1D) include oxides, the patterning of the protection spacer layer 220 includes a dry etching using fluoride-based etchants, although other applicable etchants may be used. In some embodiments where the protection spacer layer 220 (referring to FIG. 1D) is silicon nitride, the patterning of the protection spacer layer 220 includes a dry etching using $CH_2F_2$, $CF_4$, $CH_xF_y$, $CHF_3$, $CH_4$, $N_2$, $O_2$, Ar, He, as an etchant, although other applicable etchants may be used.

In the present embodiments, an etch rate to the top electrode 170 may be slower than an etch rate to the protection spacer layer 220 (referring to FIG. 1D) during the dry etching process. That is, the top electrode 170 may have a higher etch resistance to the dry etching process than that of the protection spacer layer 220 (referring to FIG. 1D). Through the configuration, the top electrode 170 may remain intact after patterning the protection spacer layer 220 (referring to FIG. 1D). In some embodiments, the dry etching process may also thin or remove a portion of the anti-reflection layer ARC exposed by the trench MT11.

In some embodiments, the protection spacers 222 are formed in the via opening O2. For example, the protection spacers 222 cover sidewalls of the interlayer dielectric layer 210, the dielectric layer 200, the protection layer 190, and leave the top surface of the top electrode 170 uncovered. The protection spacers 222 may be in contact with a top surface of the top electrode 170. Through the configuration, the protection spacers 222 further reduce the size of the via opening O2. In some embodiments, the protection spacers 224 and 226 are formed in the trench openings MT11 and MT12, respectively. For example, the protection spacers 224 cover sidewalls of the mask layer M1 and the anti-reflection layer ARC in the cell region CR, and the protection spacers 226 cover sidewalls of the mask layer M1 and the anti-reflection layer ARC in the logic region LR.

Figure 1F:
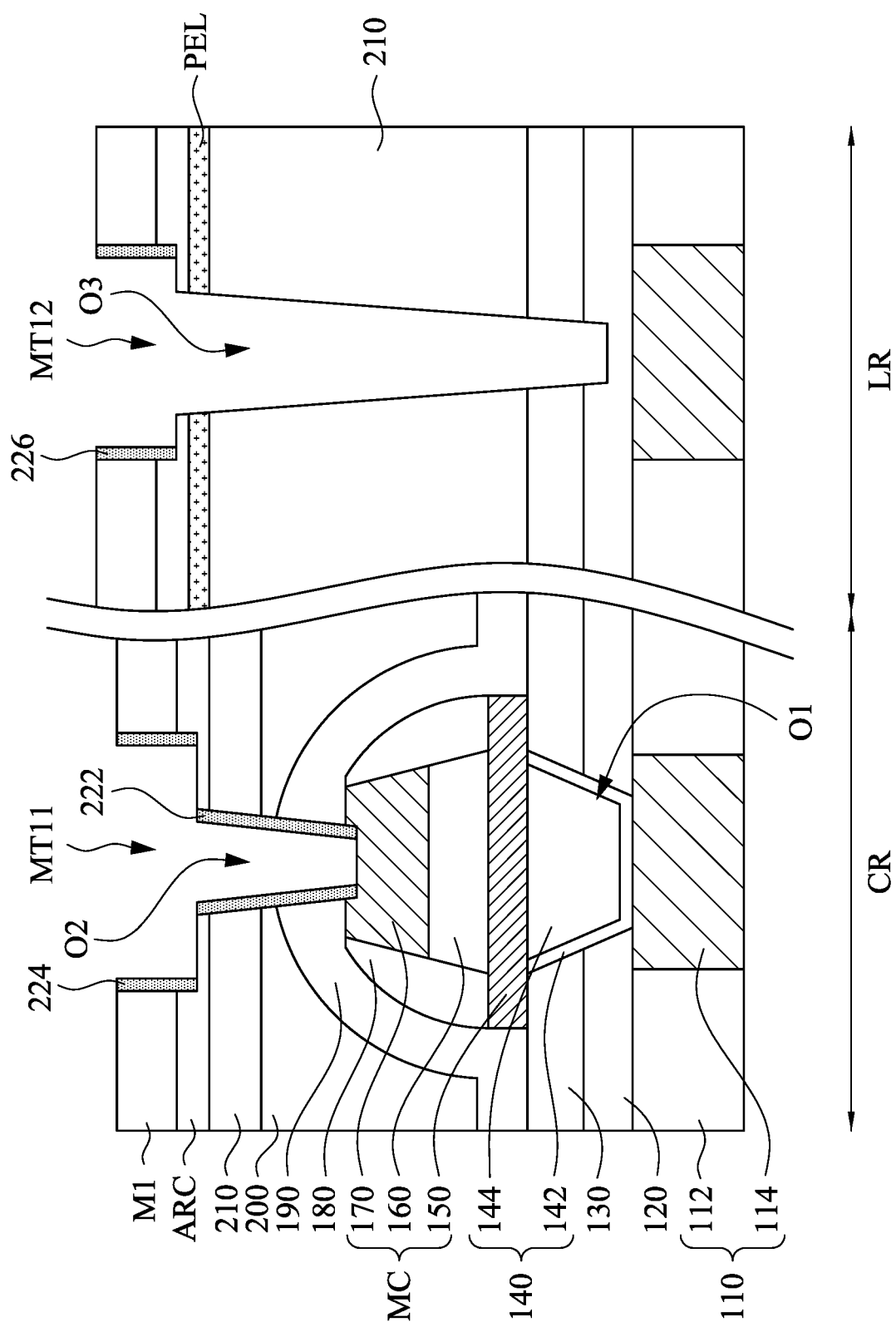

Reference is made to FIG. 1F. At least one via opening O3 is formed in the interlayer dielectric layer 210 in the logic region LR. The formation of the via opening O3 may include forming a resist layer (not shown) over the mask layer M1, the hard mask layer PEL, and the interlayer dielectric layer 210, patterning the resist layer into a patterned resist mask using a suitable photolithography process, and remove portions of the anti-reflection layer ARC, the hard mask layer PEL, and the interlayer dielectric layer 210 not protected by the patterned resist mask.

In some embodiments, the resist mask is a photoresist. In some embodiments, the resist mask is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof. The patterned resist mask may expose portions of the materials (e.g., the anti-reflection layer ARC, the hard mask layer PEL, and/or the interlayer dielectric layer 210) in the logic region LR and cover the entire cell region CR.

Then, one or more etching processes are then performed to remove portions of the anti-reflection layer ARC, the hard mask layer PEL, and the underlying interlayer dielectric layer 210 and the dielectric layer 130 not protected by the patterned resist mask, thereby forming the via opening O3. The etching processes may include anisotropic etching processes. In some embodiments where the interlayer dielectric layer 210 and the dielectric layer 130 includes silicon oxide, the etchant used in etching the via opening O3 can be dilute hydrofluoric acid (HF), HF vapor, $CF_4$, $C4F_8$, $CH_xF_y$, $C_xF_y$, $SF_6$, or $NF_3$, Ar, $N_2$, $O_2$, Ne, gas. The etch stop layer 120 may have a higher etch resistance to the etching processes than that of the interlayer dielectric layer 210 and the dielectric layer 130, thereby protecting underlying layers from being etched. That is, the etch stop layer 120 has a slower etch rate during the etching processes than that of the interlayer dielectric layer 210 and the dielectric layer 130. In some embodiments, the etching processes may further consume and remove a portion of the etch stop layer 120. The patterned resist mask is then removed using, for example, an ash process, after the etching process.

Figure 1G:
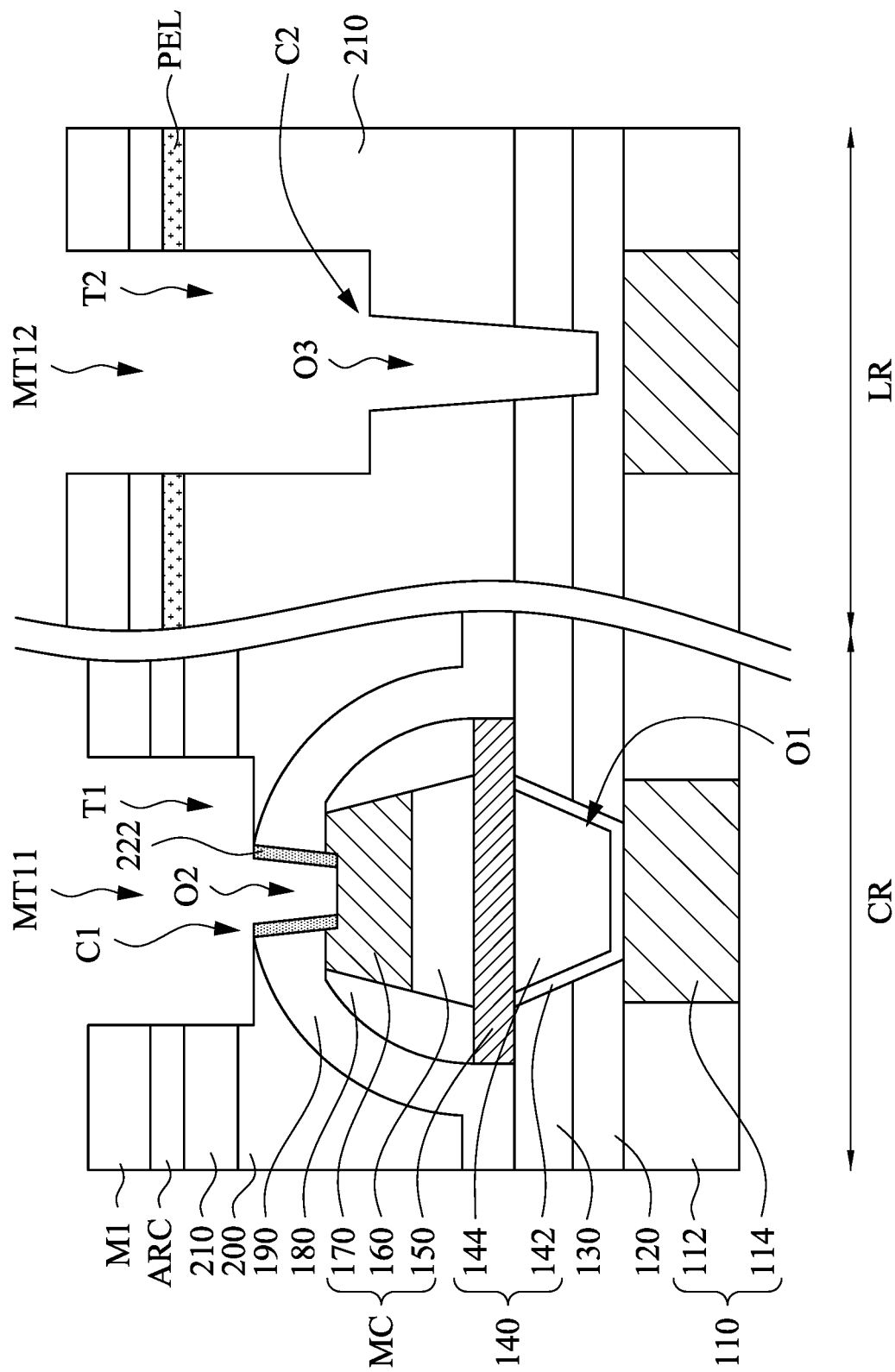

Reference is made to FIG. 1G. Trench openings T1 and T2 are formed in the interlayer dielectric layer 210 in the cell region CR and the logic region LR, respectively. The trench openings T1 and T2 are respectively in communication with the via openings O2 and O3. In the present embodiments, one or more etching processes are performed to remove portions of the interlayer dielectric layer 210 not protected by the mask layer M1, thereby forming the trench openings T1 and T2 in the interlayer dielectric layer 210. The mask layer M1 may have a higher etch resistance to the etching process than that of the interlayer dielectric layer 210, thereby protecting the underlying layers from being etched. The etching processes may be anisotropic etching processes. For example, in some embodiments, where the interlayer dielectric layer 210 includes silicon oxide, the etchant used in etching the trench openings T1 and T2 can be dilute hydrofluoric acid (HF), HF vapor, $CF_4$, $C_4F_8$, $CH_xF_y$, $C_xF_y$, $SF_6$, $NF_3$, Ar, $N_2$, $O_2$, Ne, gas.

The etching processes may further remove the protection spacers 224 and 226 (referring to FIG. 1F) and a portion of the protection spacers 222 out of the via opening O2, and remaining a portion of the protection spacers 222 in the via opening O2. In some embodiments, the mask layer M1 may have a higher etch resistance to the etching process than that the protection spacers 224 and 226 (referring to FIG. 1F). In some embodiments, the etching processes may further deepen the via openings O2 and O3. For example, in some other embodiments, the via opening O3 may expose the metallization pattern 114 after the formation of the trench openings T1 and T2.

Figure 1H:
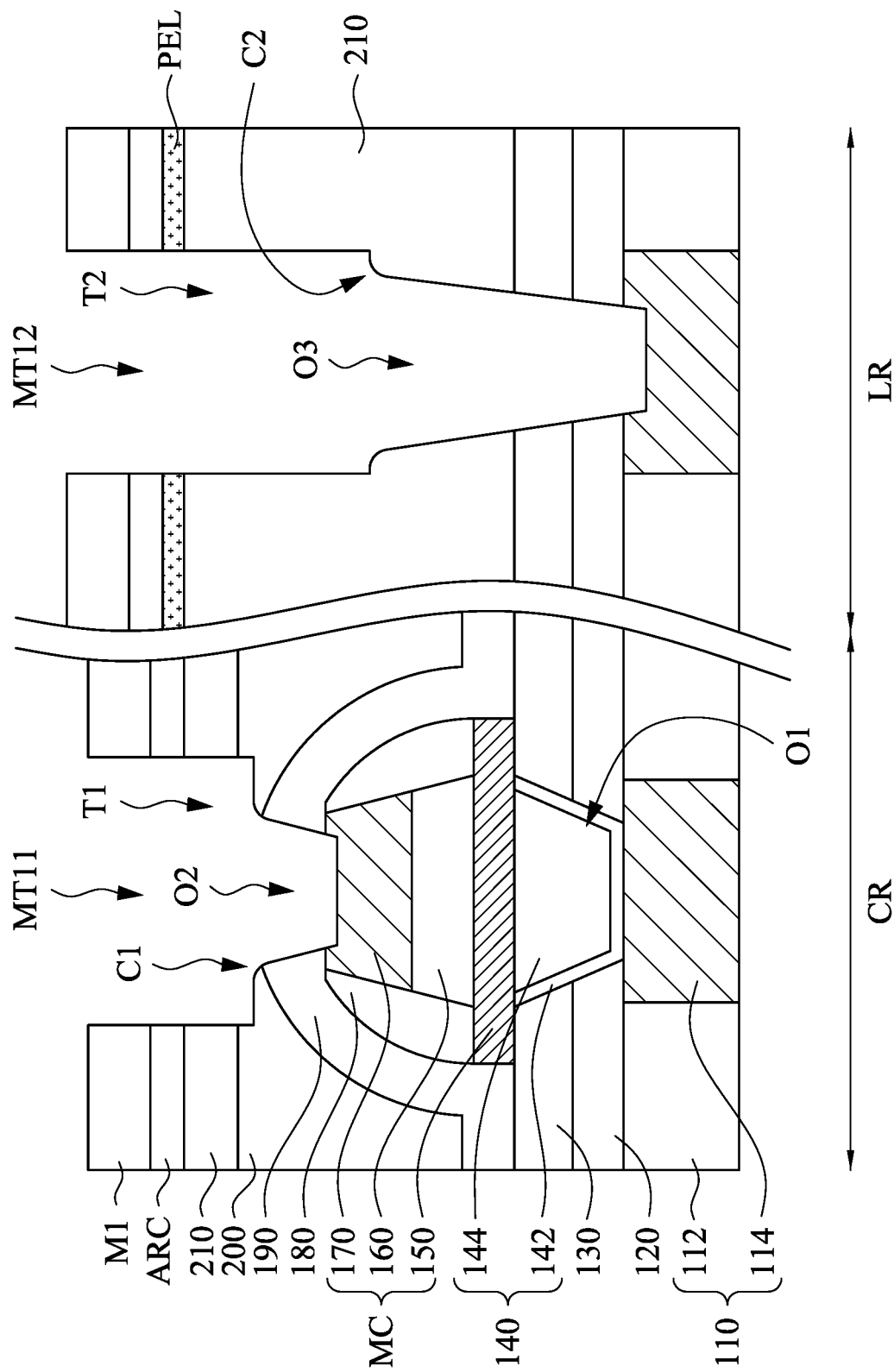

Reference is made to FIG. 1H. A liner removal process is performed to the structure of FIG. 1G. The liner removal process may include one or more isotropic etching processes, such as dry etching processes using $CH_2F_2$ and Ar as etching gases. The liner removal process may clean sidewalls of the via openings O3 and trench openings T2 in the logic region LR, thereby sloping the sidewalls of the via openings O3 and rounding a corner C2 between the via opening O3 and the trench opening T2. Through the configuration, conductive materials may easily fill into the via opening O3 in the subsequent process. The liner removal process may also be referred to as a corner rounding process in some embodiments. The liner removal process may expand or widen the via opening O3. In some embodiments, the liner removal process (e.g., dry etching process) may also clean sidewalls of the via openings O2 and trench openings T1 in the cell region CR. For example, the liner removal process may remove the spacer 222 (referring to FIG. 1G), slope the sidewalls of the via openings O2 and round a corner C1 between the via opening O2 and the trench opening T1. Similarly, the liner removal process may also enlarge or widen the via opening O2.

At a final stage of the liner removal process (e.g., after rounding the corner C2), the dry etching process of the liner removal process may be controlled to further remove a portion of the etch stop layer 120 underlying the via opening O3, thereby allowing the metallization pattern 114 exposed by the via opening O3. For example, the portion of the etch stop layer 120 underlying the via opening O3 can be removed by using suitable dry etching process. The dry etching process may have a high selectivity such that the dry etching process may stop at the metallization pattern 114. In some embodiments, after the dry etching process, the metallization pattern 114 may have a recess caused by the dry etching processes.

In absence of the spacer 222 (referring to FIG. 1G), during the liner removal process, the via opening O2 has a large space exposed to the etch gas, such that the sidewall of the via opening O2 and the top electrode 170 exposed by the via opening O2 may be rapidly etched, which in turn may overly enlarge the via opening O2 and consume or damage the top electrode 170. In some cases, due to the over-enlarged via opening O2 and the damaged top electrode 170, the underlying resistance switching element 160 may be exposed to the etch gas, which in turn will result in damage in the resistance switching element 160 during the liner removal process.

In the present embodiments, the via opening O2 surrounded by the spacer 222 (referring to FIG. 1G) has a limited space exposed to the etch gas, thereby reducing an etch rate of the sidewall of the via opening O2 and an etch rate of the top electrode 170 exposed by the via opening O2 during the liner removal process. Through the configuration, when the via opening O3 is enlarged (e.g., expanded or widened) by the liner removal process, the via opening O2 is less enlarged (e.g., less expanded or less widened), such that the top electrode 170 may be less etched or consumed by the liner removal process, which in turn will protect the underlying resistance switching element 160 from being damaged during the liner removal process.

In some embodiments, the spacer 222 may have a higher etch resistance to the liner removal process than that of the top electrode 170 and that of the protection layer 190, such that the liner removal process may not overly expand or widen the via opening O2. For example, the spacer 222 may be made of ceramic material.

Figure 1I:
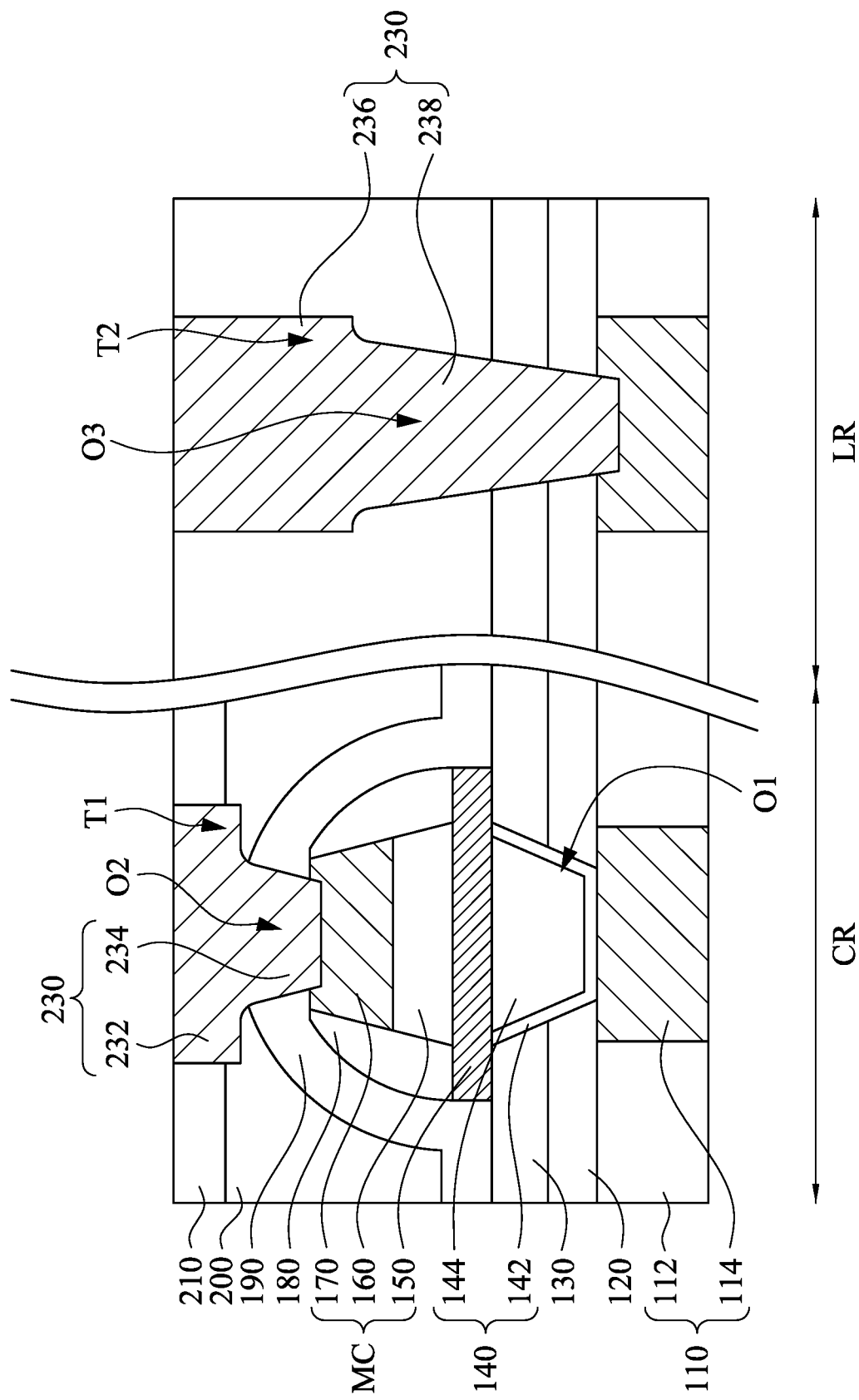

Reference is made to FIG. 1I. A metallization pattern 230 is then formed in the interlayer dielectric layer 210. Formation of the metallization pattern 230 may include filling one or more metals (e.g., copper) in the via openings O2 and O3 and the trench openings T1 and T2 to form the metallization pattern 230. After the via openings O2 and O3 and the trench openings T1 and T2 are filled with metals, a planarization process is performed to remove an excess portion of the metals outside the trench openings T1 and T2, and therefore the metallization pattern 230 is formed. The planarization process may include a chemical-mechanical polish (CMP) process. In some embodiments, the planarization process (e.g., the CMP process) may also remove the mask layer M1 and the hard mask layer PEL from the interlayer dielectric layer 210.

Through the configuration, the metallization pattern 230 includes a metal line 232 in the trench opening T1 and a conductive via 234 in the via opening O2, such that the metallization pattern 230 may be electrically connected to the top electrode 170 of the memory cell MC. The conductive via 234 may also be referred to as a top electrode via in some embodiments. The metallization pattern 230 may include a metal line 236 in the trench opening T2 and a conductive via 238 in the via opening O3, such that the top electrode 170 of the electrically connected to the metallization pattern 114. Through the configuration, the metallization pattern 230 can reach and electrically connect the metallization pattern 114 and the top electrodes top electrode 170 of the memory cell MC. As shown in the figure, since the liner removal process rounding a corner between the via opening O2/O3 and the trench opening T1/T2, the conductive via 234/238 and the metal line 232/236 may have a rounded corner therebetween.

Figure 2:
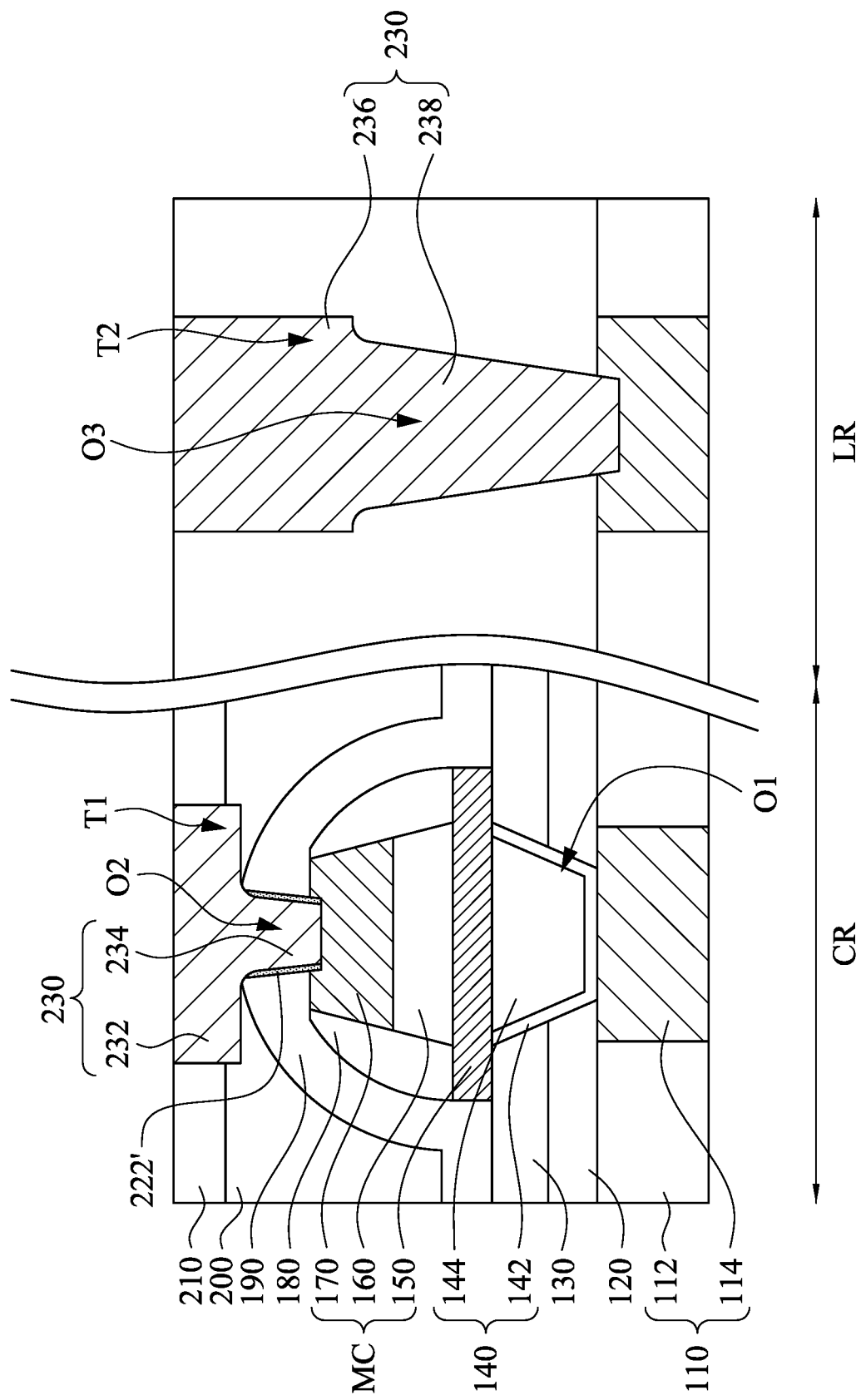
FIG. 2 is a cross-sectional view of an integrated circuit according to some embodiments of the present disclosure.

FIG. 2 is a cross-sectional view of an integrated circuit according to some embodiments of the present disclosure. The present embodiments are similar to the embodiments of FIG. 1I, and at least one difference between the present embodiments and the embodiments of FIG. 1I is that a spacer 222' surrounds the conductive via 234. In the present embodiments, by adjusting a thickness of the protection spacer layer 220 (referring to FIG. 1D) and parameters of the dry etching process in the liner removal process (referring to FIG. 1H), the spacer 222 (referring to FIG. 1G) may not be fully removed by the dry etching process in the liner removal process (referring to FIG. 1H). For example, a portion of the spacer 222 (referring to FIG. 1G) remains in the via opening O2 after the liner removal process. The remaining portion of the spacer 222 (referring to FIG. 1G) may be referred to as the spacer 222'. The spacer 222' may extend from a top surface of the top electrode 170 to a bottom surface of the metal line 232. For example, the spacer 222' has a bottom end in contact with the top electrode 170 and a top end in contact with a bottom surface of the metal line 232. The spacer 222' may space the conductive via 234 apart from the protection layer 190 and the dielectric layer 200. Other details of the present embodiments are similar to those aforementioned, and therefore not repeated herein.

Figure 3:
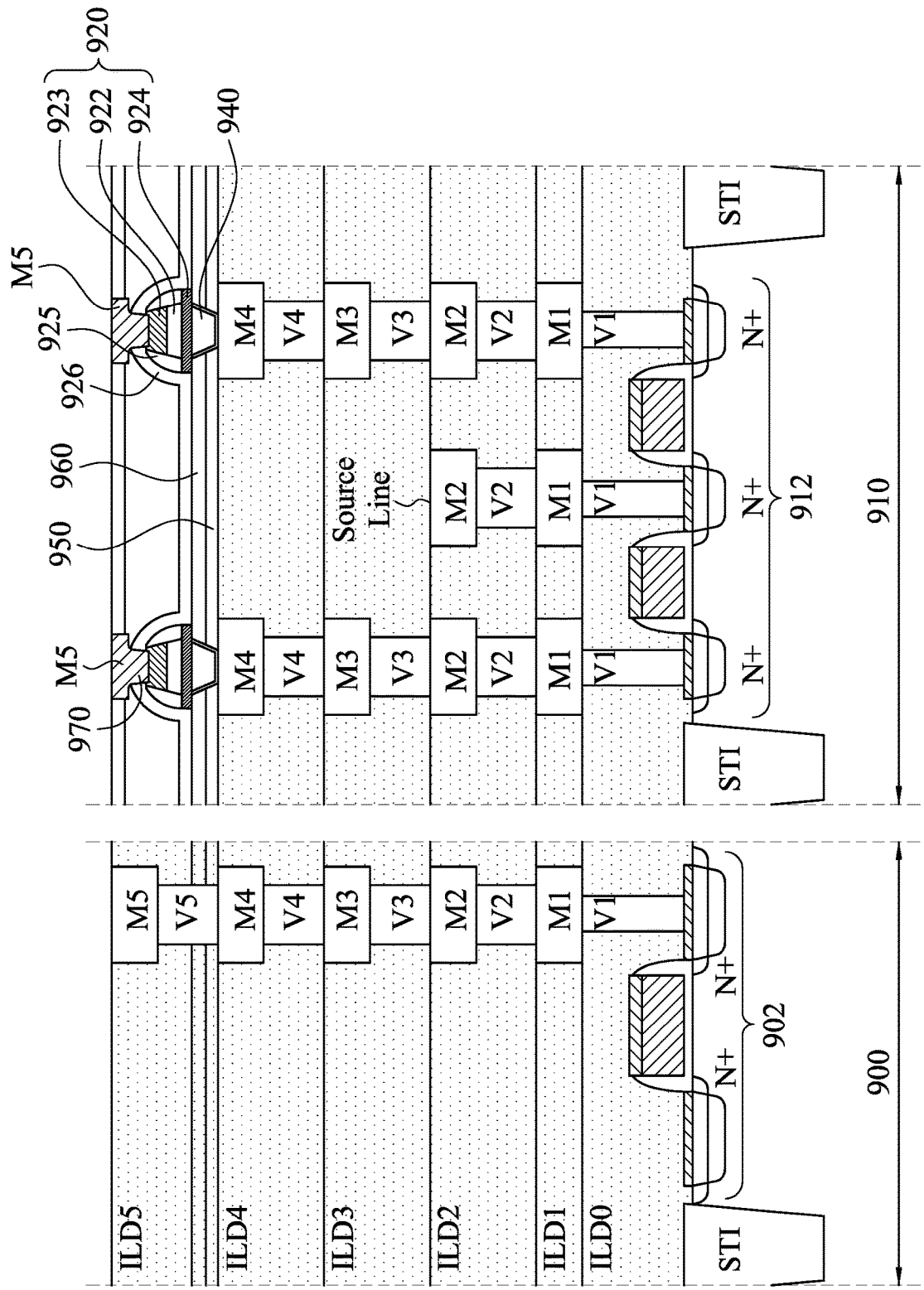
FIG. 3 is a cross-sectional view of an integrated circuit according to some embodiments of the present disclosure.

FIG. 3 is a cross-sectional view of an integrated circuit including memory devices and logic devices according to some embodiments of the present disclosure. The integrated circuit includes a logic region 900 and a cell region 910. Logic region 900 may include circuitry, such as the exemplary transistor 902, for processing information received from memory cells 920 in the cell region 910 and for controlling reading and writing functions of memory cells 920. In some embodiments, each of the memory cells 920 includes an MTJ stack 922, a top electrode 923 over the MTJ stack 922, and a bottom electrode 924 under the MTJ stack 922, and spacers 925 and the protection layer 926 surrounds the top electrode 923, the MTJ stack 922, and the bottom electrode 924.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with the interconnect V1 connecting the stack to a source/drain contact of logic transistor 902. The cell region 910 includes a full metallization stack connecting memory cells 920 to transistors 912 in the cell region 910, and a partial metallization stack connecting a source line to transistors 912 in the cell region 910. Memory cells 920 are depicted as being fabricated in between the top of the metallization layer M4 and the bottom of the metallization layer M5. The metallization layer M4 is connected with the bottom electrode 924 through a bottom electrode via 940 in an etch stop layer 950 and a dielectric layer 960, and the metallization layer M5 is connected with the top electrode 923 through the interconnect 970. Also included in integrated circuit is a plurality of ILD layers. Six ILD layers, identified as ILD0 through ILD5 are depicted in FIG. 3 as spanning the logic region 900 and the cell region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that when a liner removal process is performed to enlarge the via opening in logic region, the via opening in the cell region has a reduced space exposed to the etch gas by the configuration of spacer, such that the via opening in the cell region is less enlarged by the liner removal process. Another advantage is that the process window of the liner removal process for enlarging the via opening in logic region is relaxed.

According to some embodiments of the present disclosure, a method for fabricating an integrated circuit is provided. The method includes forming a memory cell over a substrate, wherein the memory cell comprising a top electrode, a bottom electrode, and a resistance switching element between the bottom electrode and the top electrode; forming a dielectric layer over the memory cell and the substrate; etching a via opening in the dielectric layer to expose the top electrode of the memory cell; forming a spacer in the via opening; performing a liner removal process to the dielectric layer after forming the spacer; and forming a conductive feature connected to the top electrode in the via opening.

According to some embodiments of the present disclosure, a method for fabricating an integrated circuit is provided. The method includes forming a memory cell over a first region of a substrate; forming a dielectric layer over the memory cell and over the first region of the substrate and a second region of the substrate; etching a first via opening in the dielectric layer over the memory cell; forming a spacer in the first via opening; etching a second via opening in the dielectric layer over the second region of the substrate after forming the spacer in the first via opening; and forming a first conductive feature in the first via opening to connect the memory cell and a second conductive feature in the second via opening.

According to some embodiments of the present disclosure, an integrated circuit includes a bottom electrode, a resistance switching element, a top electrode, a dielectric layer, a metal line, a top electrode via, and a spacer. The resistance switching element is over the bottom electrode. The top electrode is over the resistance switching element. The dielectric layer is over the top electrode. The metal line extends over the dielectric layer. The top electrode via connects the top electrode to the metal line. The spacer surrounds the top electrode via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, comprising:
   forming a memory cell over a substrate, wherein the memory cell comprising a top electrode, a bottom electrode, and a resistance switching element between the bottom electrode and the top electrode;
   forming a dielectric layer over the memory cell and the substrate;
   etching a via opening in the dielectric layer to expose the top electrode of the memory cell;
   forming a spacer in the via opening;
   performing a liner removal process to the dielectric layer after forming the spacer; and
   forming a conductive feature connected to the top electrode in the via opening.

2. The method of claim 1, wherein the liner removal process is performed to expand the via opening.

3. The method of claim 1, wherein the liner removal process is performed such that the spacer in the via opening is removed.

4. The method of claim 1, wherein the liner removal process is performed such that a portion of the spacer remain in the via opening.

5. The method of claim 1, wherein forming the spacer in the via opening is performed such that the spacer exposes the top electrode of the memory cell.

6. The method of claim 1, further comprising:
   etching a trench opening in the dielectric layer after etching the via opening in the dielectric layer, wherein the trench opening is in communication with the via opening.

7. The method of claim 6, wherein etching the trench opening in the dielectric layer further removes a portion of the spacer.

8. The method of claim 6, further comprising forming a mask layer over the dielectric layer, wherein etching the trench opening in the dielectric layer is performed through the mask layer, and forming the spacer in the via opening comprises:
   depositing a spacer layer over the mask layer; and
   patterning the spacer layer to form the spacer.

9. The method of claim 1, wherein the liner removal process is a dry etching process.

10. The method of claim 1, wherein forming the spacer in the via opening is performed such that the spacer is in contact with a top surface of the top electrode.

11. A method for fabricating an integrated circuit, comprising:
   forming a memory cell over a first region of a substrate;
   forming a dielectric layer over the memory cell and over the first region of the substrate and a second region of the substrate;
   etching a first via opening in the dielectric layer over the memory cell;
   forming a spacer in the first via opening;
   etching a second via opening in the dielectric layer over the second region of the substrate after forming the spacer in the first via opening; and forming a first conductive feature in the first via opening to connect the memory cell and a second conductive feature in the second via opening.

12. The method of claim 11, further comprising:
performing a dry etching process to expand the second via opening prior to forming the first conductive feature and the second conductive feature.

13. The method of claim 12, wherein the dry etching process is performed such that the spacer in first via opening is removed.

14. The method of claim 11, further comprising:
etching a first trench and a second trench in the dielectric layer after etching the second via opening, wherein the first trench is in communication with the first via opening, and the second trench is in communication with the second via opening.

15. The method of claim 14, further comprising:
performing a dry etching process to round a corner portion of the dielectric layer between the second via opening and the second trench prior to forming the first conductive feature and the second conductive feature.

16. The method of claim 11, wherein etching the second via opening in the dielectric layer is performed such that the second via opening is deeper than the first via opening.

17. The method of claim 11, wherein forming the second conductive feature in the second via opening is performed such that the second conductive feature is connected to a metallization pattern in the second region of the substrate.

18. A method, comprising:
forming a memory cell over a semiconductive substrate;
depositing a first dielectric layer over the memory cell;
depositing a second dielectric layer over the first dielectric layer;
etching a via opening in the first dielectric layer and the second dielectric layer to expose a top electrode of the memory cell;
forming a spacer extending along sidewalls of the via opening;
after forming the spacer, etching a trench opening in the second dielectric layer and over the via opening; and
filling the trench opening and the via opening with a conductive feature.

19. The method of claim 18, further comprising:
enlarging a top width of the via opening after etching the trench opening.

20. The method of claim 19, wherein enlarging the top width of the via opening is performed such that the spacer is removed from the via opening.

* * * * *